United States Patent [19]

Chappell et al.

[11] Patent Number: 4,845,669

[45] Date of Patent: Jul. 4, 1989

[54] TRANSPORSABLE MEMORY ARCHITECTURE

[75] Inventors: Barbara A. Chappell, Amawalk; Yeong-Chang Lien, Briarcliff Manor, both of N.Y.; Jeffrey Y. Tang, Los Altos, Calif.

[73] Assignee: International Business Machines Corporation, Armonk, N.Y.

[21] Appl. No.: 186,546

[22] Filed: Apr. 27, 1988

[51] Int. Cl.[4] .................... G11C 7/00; G11C 11/40
[52] U.S. Cl. .................... 365/51; 365/189.04; 365/63; 365/230.01; 365/154
[58] Field of Search ............. 365/51, 63, 189, 154, 365/230

[56] References Cited

U.S. PATENT DOCUMENTS

| | | | |
|---|---|---|---|
| 3,800,289 | 3/1974 | Batcher | 364/200 |
| 4,447,891 | 5/1984 | Kadota | 365/154 |
| 4,456,977 | 6/1984 | Hayashi | 365/63 X |
| 4,692,900 | 9/1987 | Ooami et al. | 365/63 |

Primary Examiner—Stuart N. Hecker
Assistant Examiner—Alyssa H. Bowler
Attorney, Agent, or Firm—Douglas W. Cameron

[57] ABSTRACT

A transposable memory architecture for providing equally fast access to stored data in two or more dimensions. This architecture is provided by orthogonal wiring of access devices, word lines and bit lines with independent random accessing capability for data in each direction. The transposable memory architecture (TMA) cell directly inplements the TMA architecture using only one access device per dimension of access. This invention also describes multiple transposable memory architecture (MTMA) device for additional data path flexibility. The read and write operations described provide access and cycle times approximately equivalent to those for a convention one-dimension RAM.

7 Claims, 6 Drawing Sheets

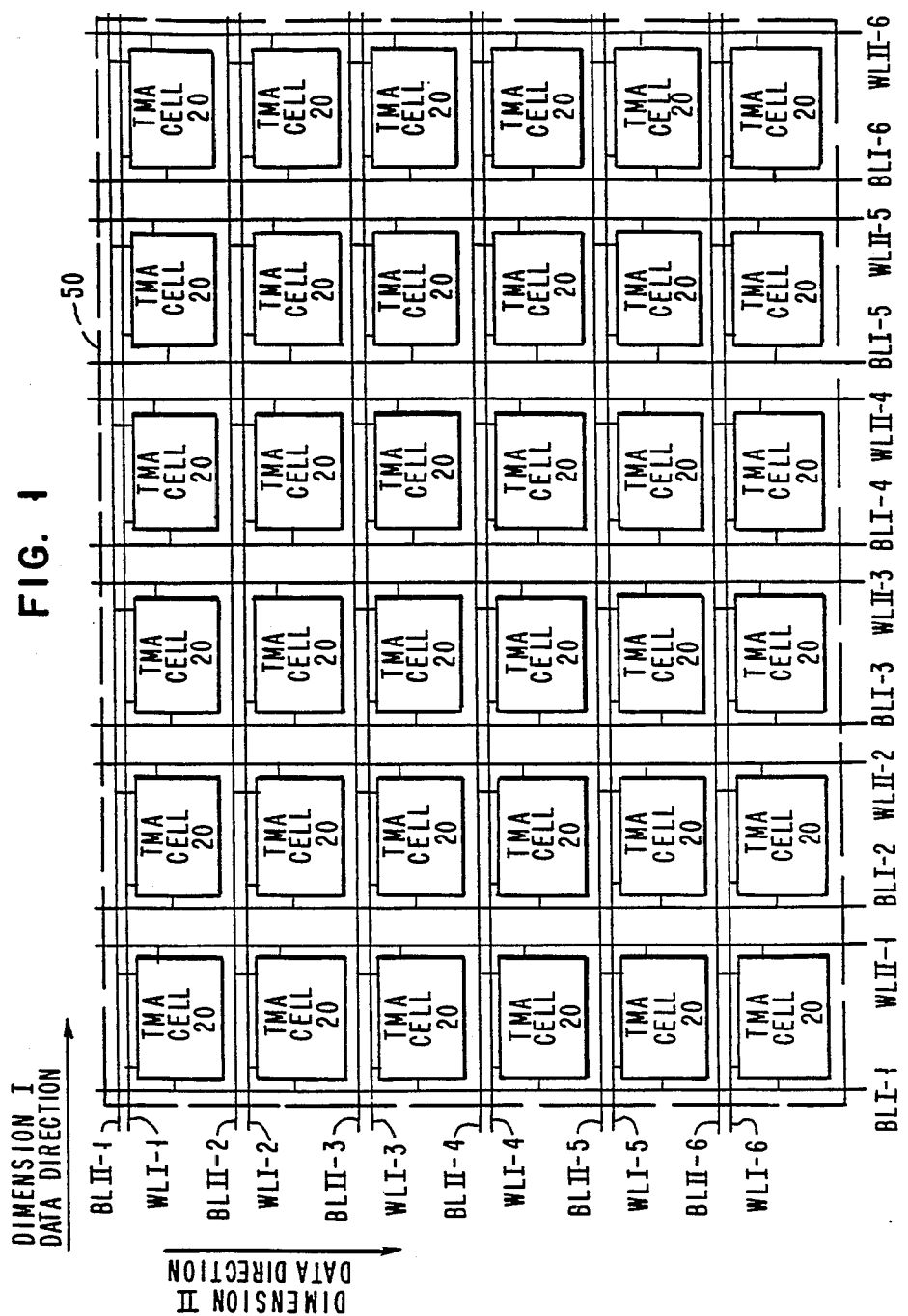

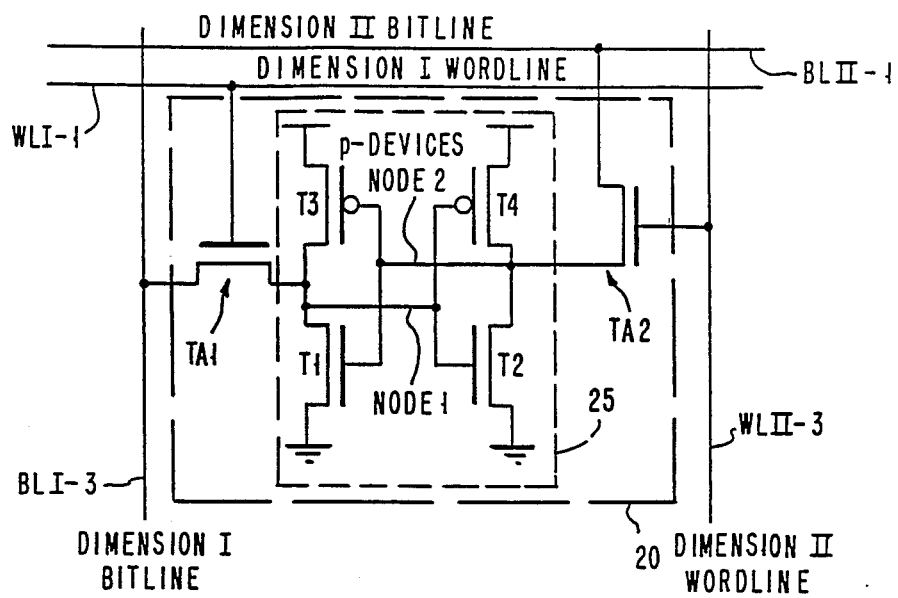
FIG. 2 TMA CELL
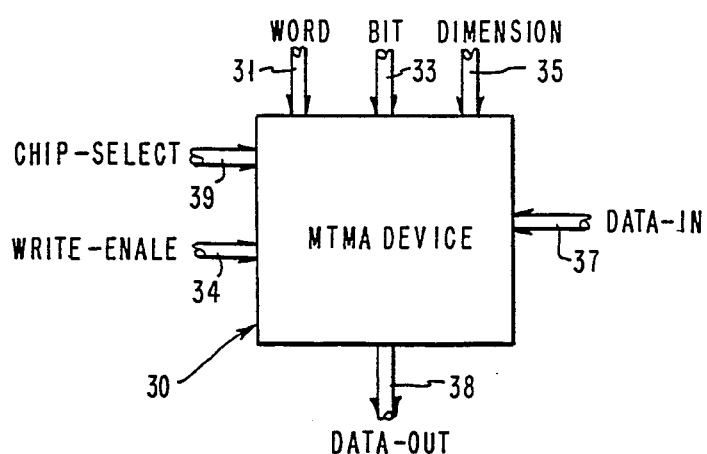
FIG. 3

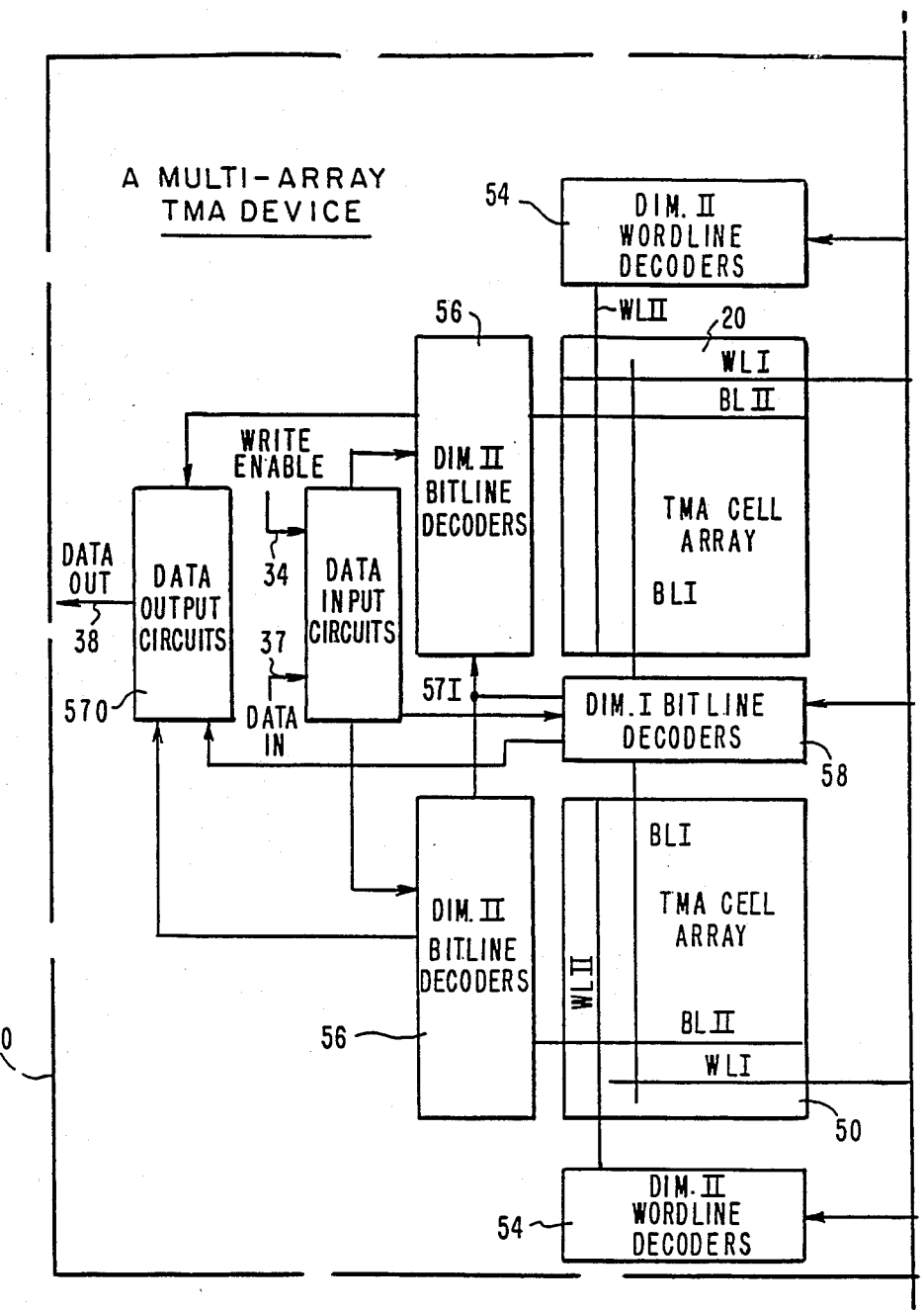
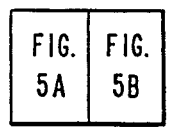
FIG. 5A
FIG. 5

TRANSPORSABLE MEMORY ARCHITECTURE

DESCRIPTION

1. Technical Field

This invention describes a Transposable Memory Architecture (TMA) for providing equally fast access to stored data in two or more dimensions. This architecture is provided by orthogonal wiring of access devices, word lines, and bit lines with independent random accessing capability for data in each direction. The TMA cell directly implements the architecture using only two access devices.

2. Background of the Invention

The use of matrix arrays of storage cells, along with the use of word lines for accessing a particular cell and bit lines for reading a particular cell is well known in the art.

More specifically, U.S. Pat. No. 4,287,575 to Eardley et al. describes a storage cell configuration in which each storage cell has only two access devices, but the cells are arranged in only a single dimension configuration.

U.S. Pat. No. 4,447,891 to Kadota describes an array of bit storage cells (memory cells) with two complementary vertical word lines (address lines) and two complementary horizontal bit lines (data lines). The two complementary horizontal bit lines (data lines) are connected through gate elements to complementary input-output nodes, while the gate elements are controlled by the vertical word lines (address lines). The word lines being parallel and the bit lines being parallel provides only single dimension accessing of stored data.

U.S. Pat. No. 3,693,169 to Kroy et al. describes a three-dimensional storage system wherein all storage positions are selectively accessible. This system requires two conductors to open each gate of the memory elements at the intersection of these two conductors and still a third conductor for the transmission of an information signal.

U.S. Pat. No. 4,494,231 to Slawy et al. describes a memory module for a time division switching system with parallel reading lines which are orthogonal to parallel writing lines.

U.S. Pat. No. 4,368,523 to Kawate also describes a matrix of memory cells wherein the address buses (word lines) are connected to the rows of the memory cells in the matrix while the data buses (bit lines) are connected to the columns of the memory cells. The address buses run parallel to each other in the horizontal direction while the data buses run parallel to each other in the vertical direction, thereby providing access to data in only one dimension.

A matrix memory module is also described in an article entitled: A Rectangular Area Filing Display System Architecture by D. S. Whelan appearing in Computer Graphics, Volume 16, No. 3, pp. 356-362, July 1982. This article features orthogonal addressing capability, but reads out in only one direction in order to provide faster rectangular area filling capability for display systems. This module has two access devices in series gated by row and column selects. This module is read or written from a single pair of bit lines only when both the row and column are selected.

U.S. Pat. No. 3,781,828 to Platt et al. features a cell with two word lines, but both word lines must be selected to read out data onto a single pair of bit lines. The objective is to provide selection capability to reduce the power dissipation in the decoders and the array. Two word lines are connected to the cell so as to incorporate an AND function. A single pair of bit lines for reading out in only one dimension is disclosed in this application.

U.S. Pat. No. 3,634,236 to Kolankowski et al. features horizontal, vertical, and diagonal accessing of a RAM array with vertical and horizontal readout, but requires that both the diagonal and either the horizontal or vertical word line be selected for a readout of the data in any one cell. The above patent deals with data in blocks, but does not provide readout from selected blocks within a larger array. Each cell in the array has six access devices, three word lines, and four bit lines. There is no description in the above patent of transposable addressing capability to a block of data within the RAM array.

U.S. Pat. No. 3,638,204 to Kolankowski et al. features a cell with six access devices, four bit lines, and three word lines for orthogonal accessing and readout if and only if, two of the three word lines are selected.

U.S. Pat. No. 3,490,007 to Igarashi features a cell with four access devices, three word lines, one pair of bit lines, and a sense line to provide the well known associative memory function. The normal one-dimensional read and write path uses one word line to gate two access devices onto the dual rail bit lines in the ordinary manner. The two extra devices, two word lines, and one sense line are for checking a slice across the array orthogonal to the bit lines for a valid compare to some input bit external to the array. Consequently, there are true and compliment word lines for each cell gating two devices both onto a single sense line. The read and write operation described in this patent can only be done through a one-dimensional path with only sense capability being provided through the orthogonal path.

U.S. Pat. No. 4,541,075 to Dill et al. features a second port to a standard DRAM array which can asynchronously read or write an entire row using a row buffer register external to the array. Though two output ports are provided, the data on the second port is from the same dimension as that on the first port.

U.S. Pat. No. 3,800,289 to Batcher features multidimensional access capability achieved with address level manipulation. The memory array has a single address selection input and a single output path. This patent does not teach orthogonal address capability implemented at the cell/array level.

All of the art described above does not disclose a memory system capable of providing single ended reads with equally fast access to random data in two or more dimensions.

SUMMARY OF THE INVENTION

It is therefore one of the objects of this invention to provide for single-ended reading of a bit storage cell or a group of bit storage cells (data-unit) in an array of such cells in either of at least two dimensions.

It is also an object of this invention to provide the above single-ended reading in multi dimensions using only one word line, one bit line and one access device per bit per dimension.

It is a further object of this invention to provide equally fast access to data-units in more than one dimension.

It is also a further object of this invention to provide for transposition of data-units with only a change in dimension address.

It is also a further object of this invention to provide additional data path flexibility by integrating multiple cell arrays in one TMA device.

It is also a further object of this invention to provide a method of writing a data-unit or a group of data-unit (data block) from only one data direction with minimal cycle time penalty.

Accordingly, this invention provides a transposable memory architecture device for a memory access system. This device comprises a matrix array of bit storage cells with n rows and m columns. Dimension I word lines are also provided for accessing the rows of the bit storage cells in the array with each dimension I word line being connected to a corresponding row of storage cells. Dimension II word lines are used for accessing the columns of the storage cells in the array with each of the dimension II word lines being connected to a corresponding one of the columns of storage cells in the array. The dimension I word lines are orthogonal to the dimension II word lines, and each storage cell in the array is connected to a corresponding one of the dimension I word lines and a corresponding one of the dimension II word lines. In addition, dimension II bit lines are used for detecting the state of the bit storage cells in corresponding rows of the matrix array. Each of the dimension II bit lines is connected to the corresponding one of the rows of the cells in the array. Dimension I bit lines are also used for detecting the state of cells in the corresponding columns of the array. Each of the dimension I bit lines is connected to corresponding one of the columns of the array. The dimension I bit lines are orthogonal to the dimension II bit lines, and each bit storage cell in the array is connected to a corresponding one of the dimension II bit lines and a corresponding one of the dimension I bit lines. The state of a selected one of the storage cells can be detected from either of two orthogonal directions by accessing the selected cell with either one of the dimension I word lines connected to the cell or with one of the dimension II word lines connected to the cell, and by detecting the state of the selected cell by reading the voltage on either the dimension II bit line connected to the selected cell or the dimension I bit line connected to the cell. It is particularly important to note that each cell in the array is connected to only a single dimension I word line, a single dimension II word line, a single dimension I bit line and a single dimension II bit line. Multiple bit-lines may be selected in either or both dimensions to provide a data-unit from multiple cells along one word line in either or both data directions.

Moreover, this invention provides a multiple transposable memory architecture device for reading data stored in the device by accessing the data in mutually orthogonal directions where more than one data-unit may be read from the device at the same time and where more than one data-unit may be written in the device at the same time. This device comprises a matrix of TMA cell arrays having N rows and M columns of such TMA cell arrays. Each i-th array in turn, has a $n_i \times m_i$ array of bit storage cells. Each TMA cell array has an associated dimension I word line decoder, dimension II word line decoder, dimension II bit line decoder and dimension I bit line decoder. Each i-th dimension I word line decoder is connected to $n_i$ dimension I word lines. Each dimension I word line is used to access the corresponding row of bit storage cells in a corresponding one of the TMA cell arrays. Each i-th dimension II word line decoder is connected to $m_i$ dimension II word lines, and each of the dimension II word lines are used to access a corresponding column of the bit storage cells in a corresponding one of the TMA cell arrays. Each i-th dimension I (dimension II) word line decoder is used to access cells on that row by placing a high or low voltage on selected ones of $n_i$ dimension I ($m_i$ dimension II) word lines. Each i-th dimension II bit line decoder is connected to $n_i$ dimension II bit lines, and each dimension II bit line is used to detect or establish the state of a first bit storage cell in a corresponding row of cells in a corresponding one of the TMA cell arrays. This first cell can be a cell which has been accessed by a dimension II word line corresponding to the column in which the first cell is located. Each i-th dimension I bit line decoder is connected to $m_i$ dimension I bit lines, and each of the dimension I bit lines is used to detect or establish the state of a second bit storage cell in a corresponding column in a corresponding one of the TMA cell arrays. This second cell can be a cell which has been accessed by a dimension I word line corresponding to the row in which the second cell is located. Each i-th dimension I (dimension II) bit line decoder is also used to select a subset in a set of $m_i$ dimension I ($n_i$ dimension II) bit lines.

BRIEF DESCRIPTION OF THE DRAWINGS

FIG. 1 is a schematic illustration of the transposable memory architecture device or TMA cell array of this invention.

FIG. 2 is a schematic illustration of a bit storage cell (or TMA cell) used in this invention.

FIG. 3 is a schematic of a multiple transposable memory access device.

DESCRIPTION OF THE PREFERRED EMBODIMENT

Figure 4:
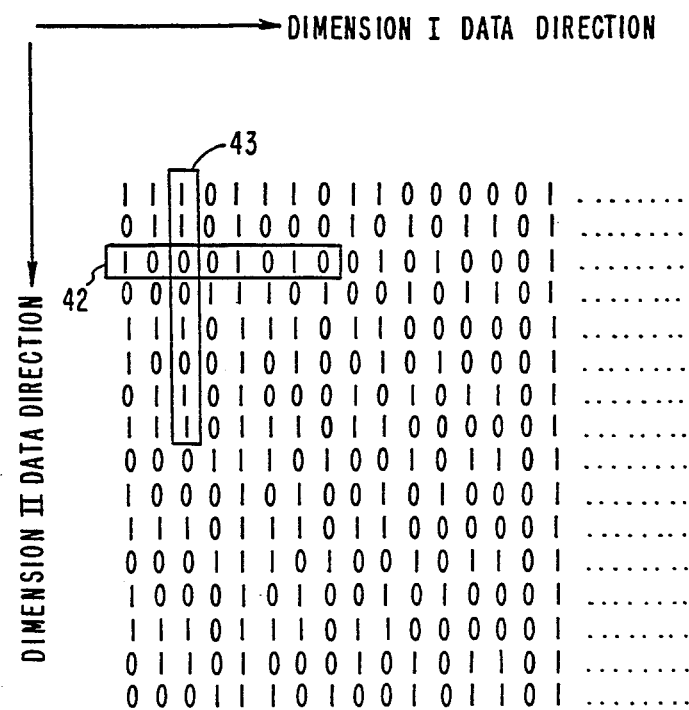
FIG. 4 is an array of data bits showing data units extending in the horizontal and vertical data directions (also known as dimension I or dimension II data direction).

Shown in FIG. 1 is a matrix array of bit storage cells with the array having n rows and m columns. In this figure n=m=6, but any suitable integer may be used, and n need not equal m. Each bit storage cell 20 is connected to a pair of word lines and a pair of bit lines. Each pair of word lines consists of a dimension I word line (WLI) and a dimension II word line (WLII) with the dimension I word line being orthogonal to the dimension II word line. Each bit storage cell 20 is also connected to a pair of bit lines. Each pair of bit lines consists of a dimension II bit line (BLII) and a dimension I bit line (BLI) with the dimension I word line being orthogonal to the dimension II word line. Each dimension I word line is connected to a corresponding row of bit storage cells in the array. Each dimension I word line is used for accessing the corresponding row of bit storage cells in the array. Similarly, each dimension I word line is connected to a corresponding column of bit storage cells in the array, and is used to access that corresponding column of bit storage cells in the array. The bit lines, on the other hand, are used to detect the state of corresponding bit storage cells in the array. A bit line (dimension I or II) is also used to write in the state of cell which has been accessed by a corresponding word line (dimension I or II). As with the dimension I word lines, each dimension II bit line is connected to a corresponding one of the rows of bit storage cells in the array. Also, each dimension I bit line is connected to a corresponding one of the columns of bit storage cells in the array. Also shown in FIG. 1 are six dimension I word lines WLI-1 through WLI-6 extending in the horizontal or dimension I data direction. Additionally shown in FIG. 1 are six dimension II word lines WLII-1 through WLII-6 extending in the vertical or dimension II data direction. Also shown in FIG. 1 is the dimension I data direction which is the horizontal direction and the dimension II data direction which is the vertical direction. The corresponding bit lines for each dimension can also be seen in FIG. 1; BLI-1 through BLI-6 extend in the vertical direction and BLII-1 through BLII-6 extend in the horizontal direction.

Shown in FIG. 2 is the bit storage cell (20) used in the preferred embodiment of this invention.

The bit storage cell (also known as a TMA cell) has a CMOS latch (25) with devices T1, T2, T3 and T4. The storage cell also has two NMOS access devices TA1 and TA2. However, the access devices could also be PMOS devices, while the latch could also be a PMOS latch or an NMOS latch with either dynamic storage or resistive loads. Also shown in FIG. 2 are dimension I and dimension II word lines, connected to access devices TA1 and TA2 respectively. More specifically, as an example, dimension I word line WLI-1 and dimension II word line WLII-3 are shown. Also shown are the dimension I and II bit lines connected to TA1 and TA2 respectively. Again as an example, dimension I bit line BLI-1 and dimension II bit line BLII-3 are shown. The word and bit lines specifically mentioned above correspond to the bit storage cell in the first row and third column of the matrix array of bit storage cells shown in FIG. 1.

For the purposes of reading and writing, the terms (word line) and (bit line) are used in the conventional sense. When the word line is selected, the state of the cell is read out onto the bit line, or the state of the bit line is written into the cell. For example, when the dimension I word line is selected, the state of node 1 may modulate the voltage level of the dimension I bit line. The dimension II word line of the same cell, or another cell, may be simultaneously selected in order to allow the state of node 2 to modulate the voltage level of the dimension II bit line. To write any one cell, however, both word lines and both bit lines need to be driven either simultaneously or sequentially. The single ended procedure for reading and the dual ended procedure for writing the bit storage cell will be described below.

As in a conventional RAM, the state of several cells (a data-unit) associated with the same word line may be read simultaneously by selecting several bit lines. In most applications, the higher bandwidth provided by a multi-bit data-unit is the preferred embodiment. With a TMA device a data-unit from either or both dimensions may be accessed in one cycle. With the TMA cell the cycle time to read a data-unit is nearly equivalent to that for a conventional RAM. Additionally, the TMA cell array provides dual dimensional access capability with very little, if any, increase in area relative to a conventional cell.

A preferred embodiment of a Transposable Memory Architecture (TMA) or a Multiple Transposable Memory Architecture (MTMA) device is shown in FIG. 3 with the input and output ports indicated. The data-unit which is read is output through port 38; the data-unit to be written is input through port 37. A data-unit is selected from the TMA array by word and bit addressing through ports 31 and 33 under control of the chip-select 39 and write-enable 34 inputs in the conventional manner.

In contrast to the conventional memory architecture, an additional address—the "dimension address"—(received through input port 35) defines the dimension from which the data-unit is to be selected or, possibly, to which it is to be written. FIG. 4 illustrates the transposition of the data-unit that results from switching the dimension bit while keeping the word and bit addresses fixed. Suppose, for example, a particular address plus a "1" dimension bit state results in the third data-unit (42) of dimension I being read, which is in the third row of the FIG. 4 data block. Then, switching the dimension bit to the "0" state without changing the word or bit address results in the third data-unit (44) of dimension II being read, which is the third column of the FIG. 4 data block. Accomplishing the same transposition in the case of a conventional memory architecture, would require many cycles of the TMA device; typically, the number of cycles required would be equal to the width of the data-unit (8 in FIG. 4).

Figure 5B:
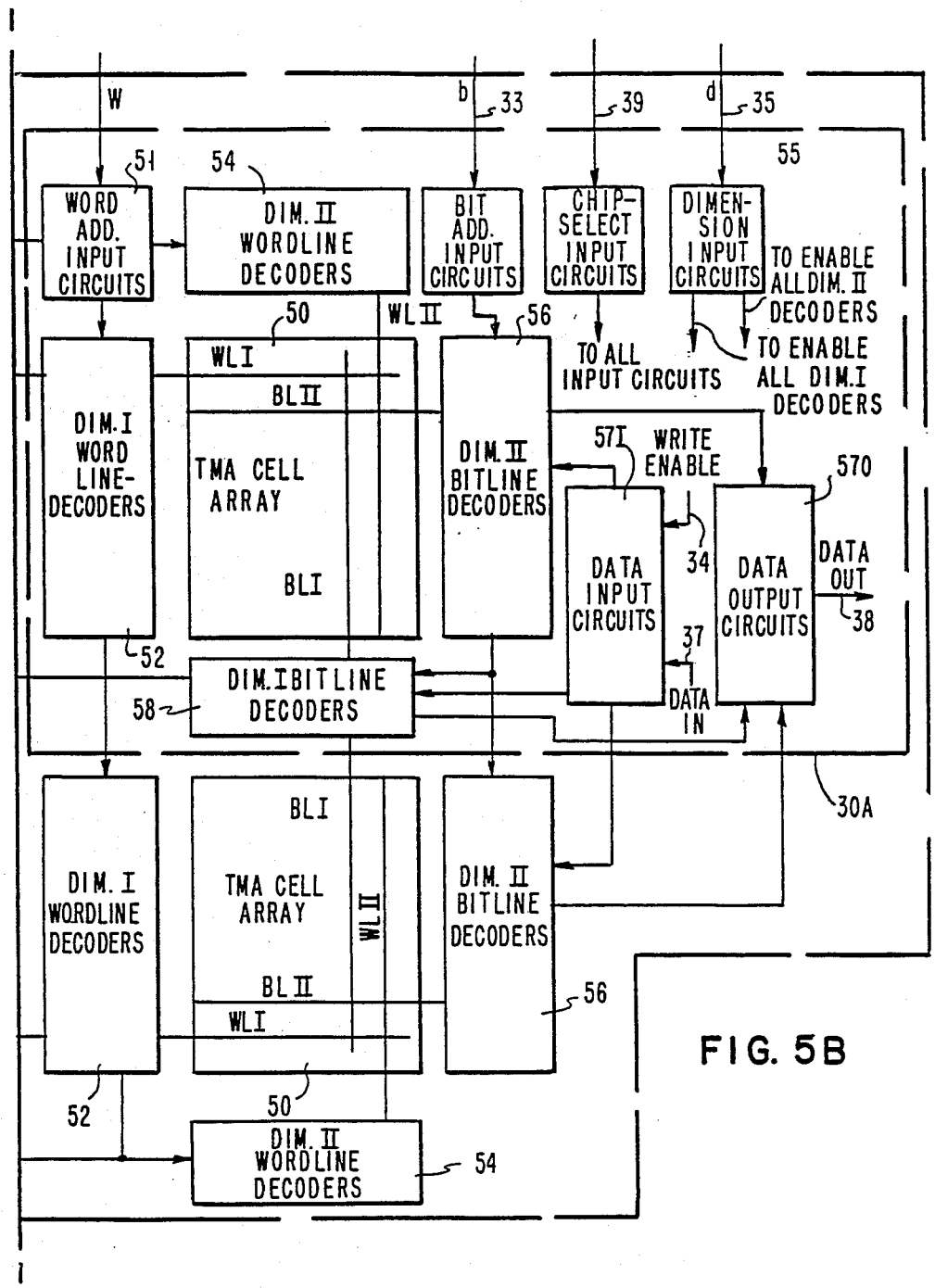
FIG. 5 is a block diagram illustration of the transposable memory architecture device including the decoders and input and output circuitry. This device is a matrix of TMA cell arrays having two rows and two columns or four quadrants.

A more detailed block diagram of a multiple TMA device is shown in FIG. 5. A basic single-array TMA device 30A(delineated by dashed box) consists of an array of TMA cells (FIGS. 1 & 2), a word and bit decoder for each dimension (52, 54, 56, 58), input circuits 51, 53 and 55 for the address ports 31, 33 and 35 and input circuits 59 for chip-select port 39, and data input circuits 57I for ports 34 and 37 and output circuits 57O for driving output ports 38. Again referring to FIGS. 3 and 5 input circuits 51, 53, 55, 57I, and 59 detect the state of associated input ports and drive buses to distribute signals within the MTMA device as indicated in FIG. 5. More specifically, input circuit 51 detects the state of the address bits to input port 31 and drives the address inputs to corresponding word line decoders 52 and 53. Also, input circuit 53 detects the state of the bit addresses at input port 33 and drives the address inputs to dimension I bit line decoders 58 and dimension II bit line decoders 56. Input circuit 55 detects and amplifies the state of the dimension bit at the input port 35 and the output of circuit 55 enables corresponding dimension I or dimension II decoders. Data output circuits 57O amplify the state of data transmitted to its inputs from corresponding bit line decoders and drive a corresponding data output port 38. Also shown in FIGS. 3 and 5 is chip-select input port 39. Input circuit 59 detects the state of port 39 and provides rive for the clock signal which results in all the peripheral circuitry going from a standby or precharge state to an active state, and therefore, in data being read or written. FIGS. 3 and 5 also show write-enable input port 34 which is used to control the data-in circuitry so that the data-in state is forced into selected cells through the bit lines in the case of a write, or so that the state of the cell can be detected through the bit lines in the case of a read. Standard RAM peripheral circuits and logic can be used for the above described functions; they therefore will not be shown in further detail.

In FIG. 5 the lines interconnecting the address input circuits, decoders, and array indicate that the same word and bit addresses are used for each dimension. The dimensional bit is used to selectively enable the dimension that will be sensed, amplified, and bussed through the bit decoders and output circuitry to the device outputs, or that will be written under control of the data-input circuitry (includes write-enable inputs). The dimension address input need only select which bit-decoder dimension output is connected to the data-output circuitry. This selection can happen late in the critical path and, therefore, have minimal impact on read access time. However, a power and di/dt (rate of change of current) savings could result from also selectively enabling the word decoders and the sense circuits in the bit decoders. In this latter case, the bit-decoder outputs may be simply dot-ORed.

A multi-array version 30 of the TMA device, referred to as a multiple transposable memory device (MTMA), is also shown in FIG. 5. A multi-array design is preferred for speed and for data-path versatility. If, however, power and area are more important, a single-array version may be preferred. For the multi-array case, peripheral circuit area could be minimized by sharing some of the decoders and input circuitry across adjacent array boundaries, as shown in FIG. 5. The matrix of TMA cell arrays (shown in FIG. 5) has two (N) rows and two (M) columns. Each i-th cell array in turn has an array of bit storage cells with $n_i$ rows and $m_i$ columns. For the case shown in FIG. 5, i would be an integer $1 \leq i \leq M \times N$ where i designates a specific array. $n_i$ and $m_i$ designate the number of rows and columns, respectively, in the i-th array. Each TMA cell array 50 has an associated pair of word line decoders, a dimension I word line decoder 52 and a dimension II word line decoder 54. The i-th dimension I or II word line decoder is associated with the i-th cell array with the dimension I word line decoder connected to $n_i$ dimension I word lines and with the dimension II word line decoder connected to $m_i$ word lines. Each i-th dimension I word line decoder selects a dimension I word line from the set of $n_i$ dimension I word lines and places a high or low voltage on that selected dimension I word line. This selected dimension I word line then accesses a corresponding row of bit storage cells in the i-th TMA cell array. In a similar manner, each i-th dimension II word line decoder selects one of a set $m_i$ dimension II word lines and places a high or low voltage on that selected dimension II word line which in turn is used to access a corresponding column of bit storage cells in the i-th TMA cell array. Each TMA cell array 50 also has a pair of bit line decoders, a dimension II bit line decoder 56 and a dimension I bit line decoder 58. The i-th dimension I or dimension II bit line decoder is associated with the i-th cell array with the dimension I bit line decoder connected to $m_i$ bit lines and with the dimension II bit line decoder connected to $n_i$ bit lines. Each i-th dimension I bit line decoder is used to select one of the $m_i$ dimension I bit lines, and the selected dimension I bit line is used to detect or establish the state of storage cells in a corresponding column of cells in the i-th TMA cell array. Similarly, each i-th dimension II bit line decoder selects one of the $n_i$ dimension II bit lines, and this selected line is used to detect or establish the state of bit storage cells in a corresponding row of cells in the i-th TMA cell array. In the above, the actual cell or group of cells (data-unit) whose state is detected or established depends upon which cells in the respective row or column has been accessed by a corresponding dimension I or II word line. Detecting the state of a cell corresponds to reading the cell, while establishing the state of a cell corresponds to writing a bit in the cell.

Evident from FIG. 5 is the orthogonal placement of the dimension I word and bit decoders 52 and 58 relative to the dimension II word and bit decoders 54 and 56. It is understood, however, that there are other embodiments which may be better suited to other applications. The block diagrams of FIGS. 3 and 5 show the preferred embodiment with data-in port(s) 37 and data-out port(s) 38. Other embodiments could have separate data-out and/or data-in ports for each dimension, since it is possible to simultaneously read or write the array from both dimensions. Other RAM options known in the art, such as variations in the control inputs, could be applied in the design of a TMA device for a particular application.

An alternate embodiment of the MTMA device could use the multiple arrays to provide rapid accessing of data in more than two-dimensions. Dedicated data-in buses along with dedicated decoders to each array could provide a shifting of data written-into one array relative to the same data written into another array. If n arrays are thus used, then a read access through the TMA arrays could provide any one or all of 2n data-units from 2n dimensions simultaneously.

Read Operation

Due to the independent selection, cell access, and sensing means provided for each dimension, any one data-unit can be read in one dimension while any one data-unit is being read in the other. A cell is said to be accessed when either one of the access devices TA1 or TA2 is turned on. For a read to either dimension, a single-ended read procedure is used, as follows:

1. In standby, all word lines are low and all bit lines are high ("high" may be substantially below VDD, depending on the details of the application).
2. Prior to a read-access, a drive means to the bit lines are switched so as to have a much higher impedance than can be provided by the cell zero-state. For example, either the bit line drive is turned-off and the large bit line capacitance is left floating, or a small load device is turned-on to limit the bit line swing in case a zero-state is read.
3. The word line which was selected by a word line decoder dimension I or II means external to the array is driven to a high voltage, thereby turning-on the associated access devices. That is, a high voltage is placed on the word line selected by the word line decoder.
4. The bit line is either unchanged (one-state) or it is discharged towards ground (zero-state), depending on the state of the storage latch. Whether the bit line state is to be interpreted as a one-state or zero-state depends on the dimension being read. As an example for dimension I:
   a. A one-state corresponds to the latch device T1 being off and the bit line voltage being unchanged.
   b. A zero-state corresponds to the latch device T1 being on and the bit line voltage being pulled-low.

Relative to the dimension I example for dimensions II:

a. A one-state corresponds to the latch device T2 being on and the bit line voltage being pulled-low.
b. A zero-state corresponds to the latch device T2 being off and the bit line voltage being unchanged.
5. The bit line decoders (dimension I or II) have a bit line sensing and decode means which amplify a selected bit line state (or a group of bit line states) by comparison to a reference voltage and gates the appropriate bit-states to the data-out pins. The decoders also serve to select which bit lines are to be read as described above.

The reference voltage can be derived in many ways, the simplest being a threshold drop below the bit line high voltage. The detailed design of the reference voltage generator and sense amp is too dependent on the details of any one application to be worthwhile describing here. Standard MOS SRAM and DRAM circuit techniques can readily be used (as is also the case with the other array selection and sensing means). However, the reference voltage design is not as critical as it is in the DRAM case, since the TMA cell provides a continuous read-out current instead of the small bit line voltage charge provided by the DRAM charge transfer read-out.

Write Operation

In any static RAM cell, switching the state of the latched storage means requires pulling-down the high storage node. The latch can not be switched by pulling-up the low node through the access device (TA1 or TA2 in FIG. 1) since it must be designed to have a smaller current carrying capability than the latch device (T1 or T2) in order to give a stable read. Consequently, in the TMA cell, both word lines to any one cell need to be selected in order to order to insure a write of that cell, although both word lines do not have to be selected simultaneously. Also, as in a conventional static RAM, a stable write requires that the access device (TA1 or TA2) size be designed to have a lower on-resistance than the load device (T3 or T4), so that the internal cell node (node 1 or 2) can be forced low.

To write one TMA cell is straightforward and consistent with previously described methods: word lines for both dimensions are brought high while the bit line for each dimension is held at either a high or a low voltage, depending on the state to be written. To prevent disturbance of cells which are not supposed to be written, only one cell at a time can be written simultaneously from both dimensions. Consequently, to write a data-unit larger than one bit by conventional methods, multiple cycles are required. For example, writing an 8-bit wide data-unit requires one cycle of the word line for the dimension in the data direction being written, but 8 cycles for the 8 word lines in the other dimension. If data-in ports are available for each dimension, the same 8 cycles can be used to write an 8 by 8 bit data block (which is the same number of cycles required to write that data block in a conventional one-dimension RAM). However, if data is supplied for only one dimension, as is the case for the preferred embodiment, FIG. 3, latches external to the array and extra cycles are needed to store the data for the other dimension. In this case, the number of cycles needed to write an n×n data block is 2n−1, or 15 in our 8×8 bit data block example.

However, using a new write method, for the preferred embodiment, a data-unit can be written in one cycle, or x data-units in x cycles, regardless of the number of bits constituting a data-unit. Thus, this mode allows write-time for the preferred embodiment of the TMA device to be about the same as for a conventional RAM. The key features of the preferred embodiment are a single data-input port (in other words, data for one dimension only) and a CMOS TMA cell (or any other version of the cell with a strong enough pull-up device to meet the cycle time requirements). Briefly, the procedure is to preset the data-unit(s) to be written by discharging all internal nodes on the side accessed by the dimension for which data-in is not supplied. Then each data-unit in the block which was preset can be written according to the state of the data-in, with one cycle for each data-unit.

Figure 6:
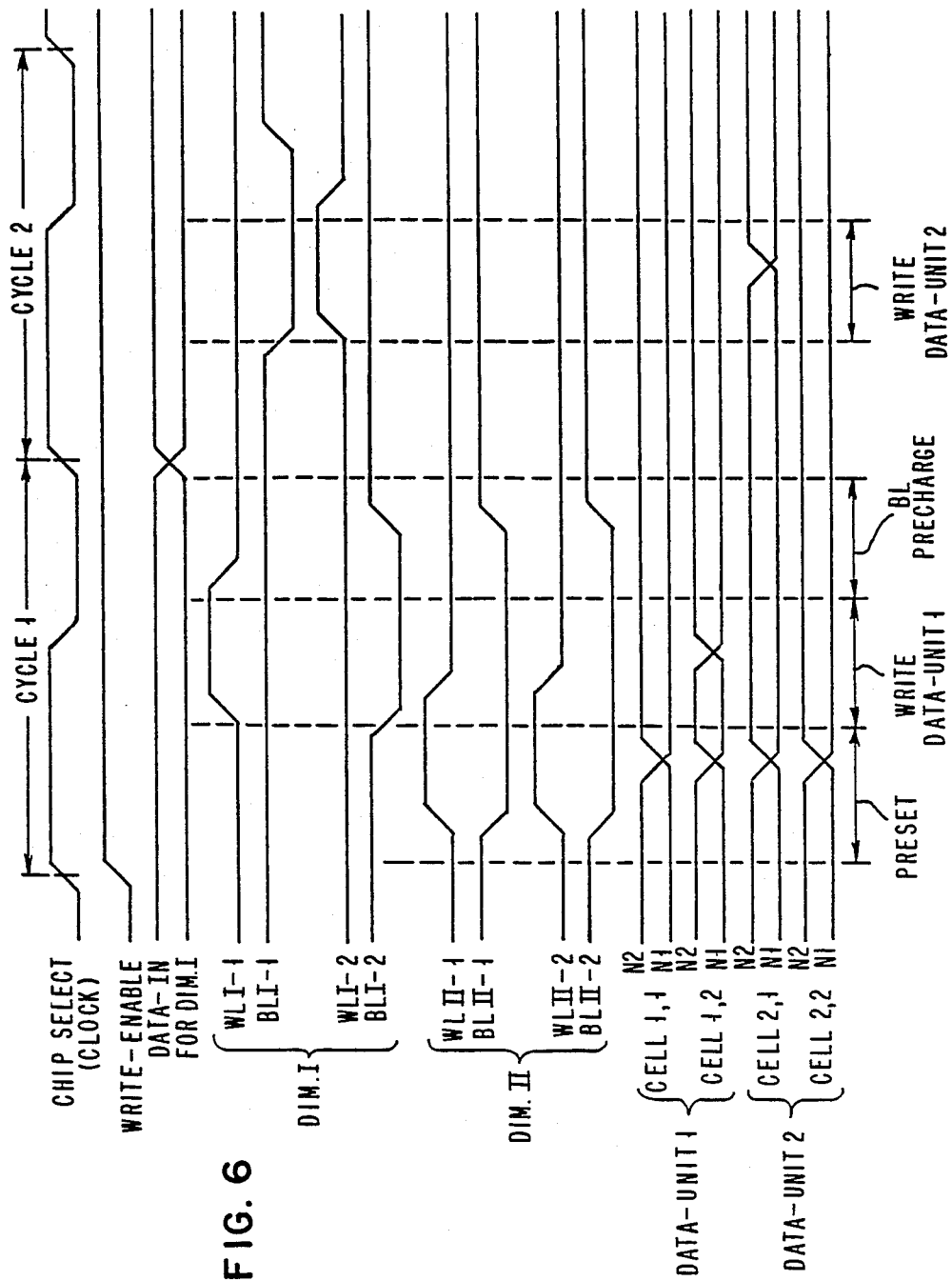
FIG. 6 is a timing diagram which illustrates a method of writing in a TMA cell array.

For a more particular example, referring to FIGS. 1 and 6, suppose the data-unit is two bits (2-bits is used for description convenience only; a much larger data-unit may be preferred for actual applications). Also suppose for this write, the word, bit, and dimension addresses select WLI-1 and BLI-1. In other words, the first two cells in the first row of FIG. 1 are to be written through the dimension I data direction. Also suppose that the write-enable input control bits indicate that two sequential words will be written. To preset the array at the beginning of the cycle, WLII-1 and WLII-2 are simultaneously pulsed while BLII-1 and BLII-2 are both held low. This sets all four cells in the selected data block to have high voltages on the side to be accessed in the dimension I data direction (node 1). (During the preset operation, unselected bit lines are all held high, preventing disturbances of other cells on the selected word lines). Then, WLI-1 can be pulsed high while BLI-1 is held high or low, depending on whether the data-in is 1 or 0. In the second cycle WLI-2 is pulsed while BLI-2 is held high or low, depending on whether the data-in is 1 or 0. Note that writing the second data-unit does not require another preset, assuming a write-enable control or a hardwired specification is available to define the depth of the data-block, which would be the preferred embodiment. The above described pulse sequence is shown by the waveforms of FIG. 6.

The preset time may extend the write cycle time for at least the first data-unit written in a data-block. However, the preset can be overlapped with the time required to sense the data-in state and to drive the data-in busses for the data-direction being written. It can also overlap the time needed to pre-charge the bit lines in the data-direction being written. The word line pulse for the pre-set can overlap the word line pulse for the write, as long as the non-overlap time for both word lines is long enough so that an internal cell node can have charged high enough to hold the written cell state. This is the case shown in FIG. 6.

The CMOS version of the TMA cell is the preferred embodiment for all the same reasons that it is becoming the preferred type in the general SRAM market. This new mode of writing the CMOS TMA cell greatly enhances the advantage offered by TMA for write-intensive applications. Thus, the TMA device supplies dimensional transposition of data with very little, if any, penalty in read or write speed relative to a standard one-dimensional RAM.

Having thus described our invention, what we claim as new, and desire by Letters Patent is:

1. In an access memory system, a transposable memory architecture device comprising:

(a) an n×m matrix array of bit storage cells having n rows and m columns;
(b) a plurality of dimension I word lines for accessing said rows of said cells in said array, with each of said dimension I word lines being connected to a corresponding one of said rows of said cells;
(c) a plurality of dimension II word lines for accessing said columns of said cells in said array, with each of said dimension II word lines being connected to a corresponding one of said columns of said cells, with said dimension I word lines being orthogonal to said dimension II word lines, and with each of said cells being connected to only a single corresponding one of said dimension I word lines and to only a single corresponding one of said dimension II word lines;
(d) a plurality of dimension II bit lines for detecting the state of said cells in said rows of said array, with each of said dimension II bit lines being connected to a corresponding one of said rows of said cells of said array; and
(e) a plurality of dimension I bit lines for detecting the state of said cells in said columns of said array, with each of said dimension I bit lines being connected to a corresponding one of said columns of said cells of said array, with said dimension I bit lines being orthogonal to said dimension II bit lines, and with each of said cells being connected to only a single corresponding one of said dimension II bit lines and only a single corresponding one of said dimension I bit lines,
whereby the state of a selected one of said storage cells can be detected from either of two orthogonal directions by accessing said selected cell with one of said dimension I word lines connected to said selected cell or one of said dimension II word lines connected to said selected cell, and by detecting the state of said selected cell by reading the voltage on one of said dimension II bit lines connected to said selected cell if said selected cell is accessed with one of said dimension II word lines connected to said selected cell, or on one of said dimension I bit lines connected to said selected cell if said selected cell is accessed with one of said dimension I word lines connected to said selected cell, and whereby the state of said selected cell can be changed by accessing said selected cell in either one of two directions, and then subsequently accessing said selected cell in the other of said two directions, wherein the state of said selected cell will change according to the voltage on said bit lines.

2. A transposable memory architecture as recited in claim 1, wherein each of said cells comprises at most two access devices and a latch, there being at most one access device for each said direction of access.

3. A transposable memory architecture as recited in claim 2 wherein each said access device has a smaller current carrying capability than any device of said flip-flop so as to provide a stable read.

4. A transposable memory architecture as recited in claim 1 further comprising: means for decoding at least one dimension bit so as to enable one of said word line decoders (either a dimension I or a dimension II word line decoder) which corresponds to the dimension indicated by said dimension bit whereby said one decoder decodes said address so as to access said selected cell in the direction indicated by said dimension bit.

5. In an access memory system, a multiple transposable memory architecture device for reading data stored in said device by accessing selected bit storage cells of said device containing said data, said accessing being in either of two mutually orthogonal directions, wherein more than one bit may be read from said device at the same time, and wherein more than one bit may be written in said device at the same time, said device comprising:
(a) an N×M matrix of TMA cell arrays having N rows and M columns, each i-th one of said arrays being an $n_i \times m_i$ array of bit storage cells;
(b) a plurality of dimension I word line decoders with each one of said TMA cell arrays having an associated one of said dimension I word line decoders;
(c) a plurality of dimension II word line decoders with each one of said TMA cell arrays having an associated one of said dimension II word line decoders;
(d) a plurality of dimension II bit line decoders with each one of said TMA cell arrays having an associated one of said dimension II bit line decoders;
(e) a plurality of dimension I bit line decoders with each one of said TMA cell arrays having an associated one of said dimension I bit line decoders;
(f) a plurality of dimension I word lines with each i-th of said dimension I word line decoders being used to place a high or a low voltage on selected ones of a set of $n_i$ dimension I word lines, each of said dimension I word lines being used (depending on whether a high or low voltage is placed thereon) to access a corresponding row of said bit storage cells in a corresponding one of said TMA cell arrays;
(g) a plurality of dimension II word lines with each i-th of said dimension II word line decoders being used to place a high or a low voltage on selected ones of a set of $m_i$ of said dimension II word lines, each of said dimension II word lines being used (depending on whether a high or low voltage is placed thereon) to access a corresponding column of said bit storage cells in a corresponding one of said TMA cell arrays;
(h) a plurality of dimension II bit lines, with each i-th of said dimension II bit line decoders being used to select a subset in a set of $n_i$ of said dimension II bit lines, each of said dimension II bit lines in said subset being used to detect or establish the state of a first of said bit storage cells in a corresponding row of said cells in said i-th of said TMA cell arrays, said first cell being a cell which has been accessed by a dimension II word line corresponding to the column in which said first cell is located; and
(i) plurality of dimension I bit lines, with each i-th of said dimension I bit line decoders being used to select a subset in a set of $m_i$ of said dimension I bit lines, each of said dimension I bit lines in said subset of being used to detect or establish the state of a second of said bit storage cells in a corresponding column of said cells in said i-th of said TMA cell arrays, said second cell being a cell which has been accessed by a dimension I word line (of said dimension I word lines) corresponding to the row in which said second cell is located,
whereby at least one of said cells from each of said arrays may be accessed at the same time and in the same manner as described in steps (h) and (i) for said i-th array.

6. A multiple transposable memory as recited in claim 5, further comprising:

means for decoding a dimension bit so as to enable word and bit line decoders which correspond to a data dimension indicated by a dimension bit, said word and bit line decoders being said dimension I word line decoder and said dimension I bit line decoder, or said dimension II word line decoder and said dimension II bit line decoder depending on whether said dimension bit indicates a dimension I data direction or a dimension II data direction.

7. In an access memory system, a multiple transposable memory architecture (MTMA) device for reading or writing a data unit stored in said device, wherein said data unit may extend in one of a multiple of mutually orthogonal direction, said device comprising:

(a) N×M matrix of TMA cell arrays having N rows and M columns, each i-th one of said arrays being an $n_i \times m_i$ array of bit storage cells;

(b) a plurality of dimension I word line decoders with each one of said TMA cell arrays having an associated one of said dimension I word line decoders;

(c) a plurality of dimension II word line decoders with each one of said TMA cell arrays having an associated one of said dimension II word line decoders;

(d) a plurality of dimension II bit line decoders with each one of said TMA cell arrays having an associated one of said dimension II bit line decoders;

(e) a plurality of dimension I bit line decoders with each one of said TMA cell arrays having an associated one of said dimension I bit line decoders;

(f) a plurality of dimension I word lines with each i-th of said dimension I word line decoders being used to place a high or low voltage on selected ones of a set of $n_i$ of said dimension I word lines, each of said dimension I word lines being used to access a corresponding row of said bit storage cells in a corresponding one of said TMA cell arrays;

(g) a plurality of dimension II word lines with each i-th of said dimension II word line decoders being used to place a high or low voltage on selected ones of a set of $m_i$ of said dimension II word lines, each of said dimension II word lines being used to access a corresponding column of said bit storage cells in a corresponding one of said TMA cell arrays;

(h) a plurality of dimension II bit lines, with each i-th of said dimension II bit line decoders being used to select a first subset in a set of $n_i$ of said dimension II bit lines, each of said dimension II bit lines in said first subset being used to detect or establish the state of said bit storage cells in a corresponding row of said cells in said i-th of said TMA cell arrays, each cell which has been accessed and which is of said corresponding row of said i-th TMA cell array being a cell which has been accessed by a dimension II word line corresponding to the column in which that cell is located;

(i) a plurality of dimension I bit lines, with each i-th of said dimension I bit line decoders being used to select a second subset in a set of $m_i$ of said dimension I bit lines each of said dimension I bit lines in said second subset being used to detect or establish the state of said bit storage cells in a corresponding column of said cells in a corresponding one of said TMA cell arrays, each cell which has been accessed and which is of said corresponding column of said i-th TMA cell array being a cell which has been accessed by a dimension I word line corresponding to the row in which that cell is located; and (j) means for decoding a dimension bit so as to enable word and bit line decoders which correspond to a data dimension indicated by a dimension bit, said word and bit line decoders being said dimension I word line decoder and said dimension I bit line decoder, or said dimension II word line decoder and said dimension I bit line decoder depending on whether said dimension bit indicates a dimension I data direction or a dimension II data direction.

* * * * *